US012774245B2

(12) United States Patent
Kim et al.

(10) Patent No.: US 12,774,245 B2
(45) Date of Patent: Oct. 27, 2026

(54) MANUFACTURING METHOD OF WINDOW

(71) Applicant: Samsung Display Co., Ltd., Yongin-si (KR)

(72) Inventors: Yu Ri Kim, Guri-si (KR); Eun-Kyung Yeon, Suwon-si (KR); Sung Hoon Kim, Asan-si (KR); Seong Jin Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 36 days.

(21) Appl. No.: 18/941,098

(22) Filed: Nov. 8, 2024

(65) Prior Publication Data

US 2025/0059084 A1 Feb. 20, 2025

Related U.S. Application Data

(62) Division of application No. 17/399,348, filed on Aug. 11, 2021, now Pat. No. 12,168,627.

(30) Foreign Application Priority Data

Dec. 17, 2020 (KR) ........................ 10-2020-0177407

(51) Int. Cl.

| | |
|---|---|
| ***C03C 21/00*** | (2006.01) |
| ***C03C 15/00*** | (2006.01) |
| ***C03C 23/00*** | (2006.01) |
| ***H05K 5/03*** | (2006.01) |

(52) U.S. Cl.

CPC ............ *C03C 21/002* (2013.01); *C03C 15/00* (2013.01); *C03C 23/0025* (2013.01); *H05K 5/03* (2013.01)

(58) Field of Classification Search

CPC .......... C03C 15/00; C03C 21/001–003; C03C 23/0025

See application file for complete search history.

(56) References Cited

U.S. PATENT DOCUMENTS

| | | | |
|---|---|---|---|
| 9,656,910 B2 | 5/2017 | Bazemore et al. | |
| 2012/0236526 A1 | 9/2012 | Weber | |
| 2013/0192305 A1 | 8/2013 | Black et al. | |
| 2014/0231390 A1 | 8/2014 | Nukaga et al. | |
| 2017/0012131 A1 | 1/2017 | Zhao | |
| 2017/0334769 A1 | 11/2017 | Luzzato et al. | |
| 2018/0029933 A1 | 2/2018 | Na Zou et al. | |
| 2018/0297892 A1 | 10/2018 | Lee et al. | |
| 2021/0107826 A1 | 4/2021 | Hwang et al. | |
| 2022/0002185 A1 | 1/2022 | Ortner et al. | |
| 2022/0106218 A1* | 4/2022 | Cao ........................ | C03C 15/00 |
| 2022/0135473 A1 | 5/2022 | Sunwoo et al. | |

(Continued)

FOREIGN PATENT DOCUMENTS

| | | |
|---|---|---|
| CN | 105428238 A | 3/2016 |
| CN | 107531564 A | 1/2018 |

(Continued)

*Primary Examiner* — Erin Snelting

(74) *Attorney, Agent, or Firm* — CANTOR COLBURN LLP

(57) ABSTRACT

A manufacturing method of a window includes: radiating a laser to a glass; immersing a laser-irradiated glass in a KOH solution to form a groove in the glass and to perform a primary reinforcement on the glass; masking the groove of a primarily reinforced glass; and performing a secondary reinforcement on a masked glass.

10 Claims, 12 Drawing Sheets

(56) References Cited

U.S. PATENT DOCUMENTS

| | | | | |
|---|---|---|---|---|
| 2022/0194848 | A1 | 6/2022 | Park et al. | |
| 2023/0278917 | A1* | 9/2023 | Ostholt | C03C 23/0025 428/156 |

FOREIGN PATENT DOCUMENTS

| | | | |
|---|---|---|---|
| KR | 1020130132608 | A | 12/2013 |
| KR | 101570658 | B1 | 11/2015 |
| KR | 1020160014571 | A | 2/2016 |
| KR | 1020170081327 | A | 7/2017 |
| KR | 101765198 | B1 | 8/2017 |
| KR | 102111138 | B1 | 5/2020 |
| WO | 2013062450 | A1 | 5/2013 |

* cited by examiner

MANUFACTURING METHOD OF WINDOW

This application is a divisional of U.S. patent application Ser. No. 17/399,348, filed on Aug. 11, 2021, which claims priority to Korean Patent Application No. 10-2020-0177407 filed on Dec. 17, 2020, and all the benefits accruing therefrom under 35 U.S.C. § 119, the content of which in its entirety is incorporated by reference.

BACKGROUND

(a) Field

The disclosure relate to a manufacturing method of a window, and more particularly, relates to a manufacturing method of a window used as a cover window of a foldable display device

(b) Description of the Related Art

With a recent development of display-related technologies, display devices that may be transformed during usage such as folding, rolling in a roll shape, or stretching are being researched and developed. Since such displays may be transformed into various forms, both the demand for the large-sized display at the use stage and the down-sized display for portability may be satisfied.

When a display device is folded, substantial stress is concentrated in the folded portion and constituent elements of the display device in the folded portion may be lifted or damaged. Particularly, in a foldable display device, some regions may receive a tensile stress and some regions may receive a compressive stress at the folded part. Such stress imbalance of the display device may damage the cover window positioned in front of the display device.

SUMMARY

Embodiments relate to a manufacturing method of a window for uniform chemical strengthening and stress distribution of a window having different thicknesses for each region An embodiment of a manufacturing method of a window according to the invention includes: radiating a laser to a glass; immersing a laser-irradiated glass in a KOH solution to form a groove in the glass and to perform a primarily reinforcement on the glass; masking the groove of a primarily reinforced glass; and performing a secondary reinforcement on a masked glass.

In an embodiment, in the immersing the laser-irradiated glass in the KOH solution, a temperature of the KOH may be in a range of about 50° C. to about 300° C.

In an embodiment, in the immersing the laser-irradiated glass in the KOH solution, an immersion time may be in a range of about 30 minutes to about 72 hours.

In an embodiment, the groove may be positioned along a predetermined direction of the glass and may not penetrate the glass.

In an embodiment, after the immersing the laser-irradiated glass in the KOH solution, a thickness of a primarily reinforced region of the glass may be in a range of about 1 nanometer (nm) to about 20 micrometers (μm).

In an embodiment, the masking the groove of the primarily reinforced glass may include filling an entire inside of the groove with a masking pattern.

In an embodiment, the performing the secondary chemical reinforcement on the masked glass may include using $KNO_3$.

In an embodiment, a thickness of a region of the glass where the secondary reinforcement is performed may be thicker than a thickness of a region of the glass where the primary reinforcement is performed.

In an embodiment, the window may include a primary reinforcement region, a secondary reinforcement region, and a non-reinforcement region.

In an embodiment, the window may be a cover window of a foldable display device, and the groove of the window may correspond to a region where the foldable display device is folded.

An embodiment of a manufacturing method of a window according to the invention includes: radiating a laser to a glass; etching the glass to which the laser is radiated to form a groove; immersing the glass including the groove in a KOH solution to perform a primarily reinforcement on the glass; masking the groove of a primarily reinforced glass; and performing a secondary reinforcement on a masked glass.

In an embodiment, the etching the glass to which the laser is radiated to form the groove may include using HF.

In an embodiment, in the immersing the glass including the groove in the KOH solution, a temperature of the KOH may be in a range of about 50° C. to about 300° C.

In an embodiment, in the immersing the glass including the groove in the KOH solution, an immersion time may be in a range of about 30 minutes to about 72 hours.

In an embodiment, after the immersing the glass including the groove in the KOH solution, a thickness of a primarily reinforced region of the glass may be in a range of about 1 nm to about 20 μm.

In an embodiment, the groove may be positioned along a predetermined direction of the glass and may not penetrate the glass.

In an embodiment, the performing the secondary reinforcement may include using $KNO_3$.

In an embodiment, a thickness of a region of the glass where the secondary reinforcement may be performed is thicker than a thickness of a region of the glass where the primary reinforcement is performed.

In an embodiment, the window may include a primary reinforcement region, a secondary reinforcement region, and a non-reinforcement region.

In an embodiment, the window may be a cover window of a foldable display device, and the groove of the window may correspond to a region where the foldable display device may be folded.

According to embodiments of the invention, the manufacturing method of the window is provided for a uniform chemical reinforcement and uniform stress distribution in a window having regions with different thicknesses from each other.

DETAILED DESCRIPTION

Figure 1:
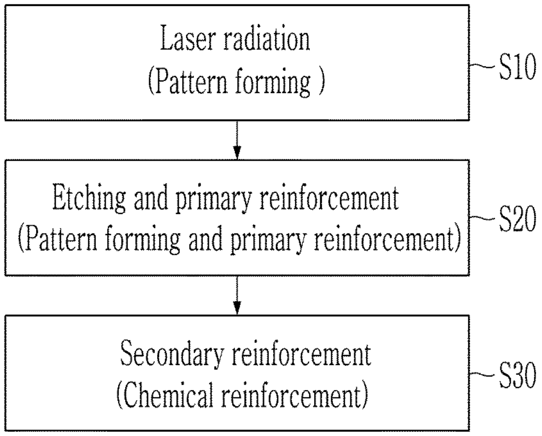
FIG. 1 is a process flowchart showing a manufacturing process of a window according to an embodiment.

The invention will be described more fully hereinafter with reference to the accompanying drawings, in which various are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The drawings and description are to be regarded as illustrative in nature and not restrictive, and like reference numerals designate like elements throughout the specification.

In addition, the size and thickness of each configuration shown in the drawings are arbitrarily shown for understanding and ease of description, but the invention is not limited thereto. In the drawings, the thickness of layers, films, panels, regions, etc., are exaggerated for clarity. In the drawings, for understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, in the specification, the phrase "in a plan view" means when an object portion is viewed from above, and the phrase "in a cross-sectional view" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Now, embodiments of a manufacturing method of a window according to the invention will be described in detail with reference to accompanying drawings.

FIG. 1 is a process flowchart showing a manufacturing process of a window according to an embodiment.

Referring to FIG. 1, an embodiment of a manufacturing process of a window includes radiating a laser to form a pattern (S10), etching and primary reinforcing (S20), and secondary reinforcing (S30).

Figure 2:
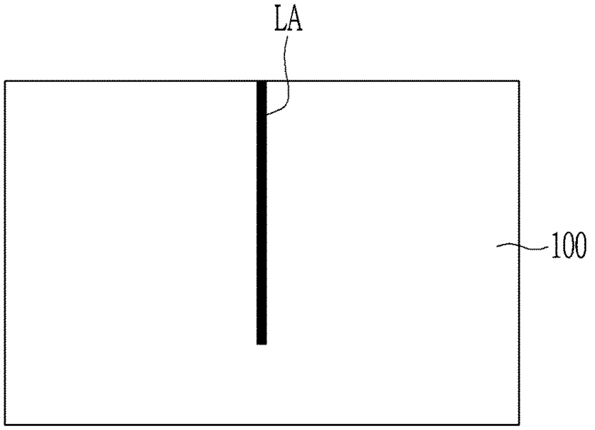
FIG. 2 is a view showing a window to which a laser is irradiated.

In such an embodiment, referring to FIG. 1, a laser is radiated to a window to form a pattern (S10). FIG. 2 is a view showing a window to which a laser is radiated. FIG. 2 shows a laser irradiated region LA. Such a laser irradiated region LA is a region to be removed later by etching, and as shown in FIG. 2, is formed on a partial region of a center of the window 100. The laser-irradiated region LA suffers thermal damage and the damaged region may be removed by the etching process in a subsequent process. In such an embodiment, a desired shape may be etched by using a difference in etch selectivity between a laser processed (or irradiated) region and a laser unprocessed (or non-irradiated) region.

In an embodiment, as shown in FIG. 1, the window to which the laser is radiated is etched and primary reinforced (S20). In such an embodiment, the etching and primary reinforcement of the window may be performed by using KOH. In an embodiment, the etching and primary reinforcement of the window may be performed by immersing the window in a chemical solution containing KOH. In such an embodiment, the reinforcement time may be about 30 minutes to about 72 hours. In such an embodiment, the temperature of the KOH may be about 50° C. or greater and about 300° C. or less. If the temperature is below about 50° C., the reinforcement of the window may not be performed, and if the temperature is above about 300° C., it may be difficult to secure the process characteristic. Accordingly, in such an embodiment, about 50° C. may be a minimum temperature at which the reinforcement depth of the window may be checked, and about 300° C. may be a maximum temperature at which the process characteristic may be secured.

Figure 3:
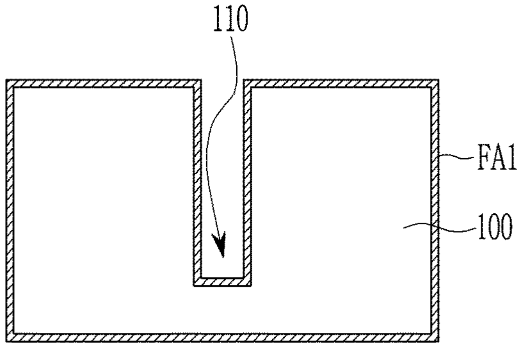
FIG. 3 is a view showing a window in which etching and primary reinforcement processes are performed.

FIG. 3 is a view showing a window in which an etching and primary reinforcement processes are performed. Referring to FIG. 3, the portion corresponding to the laser irradiated region LA of FIG. 2 is etched to form a groove 110.

In FIG. 3, the primary reinforcement region FA1 is represented. In such an embodiment, the reinforcement occurs in an edge or surface region of the window 100 by KOH. The thickness of the primary reinforcement region FA1 may be in a range of about 1 nanometer (nm) to about 20 micrometers (μm).

Figure 4:
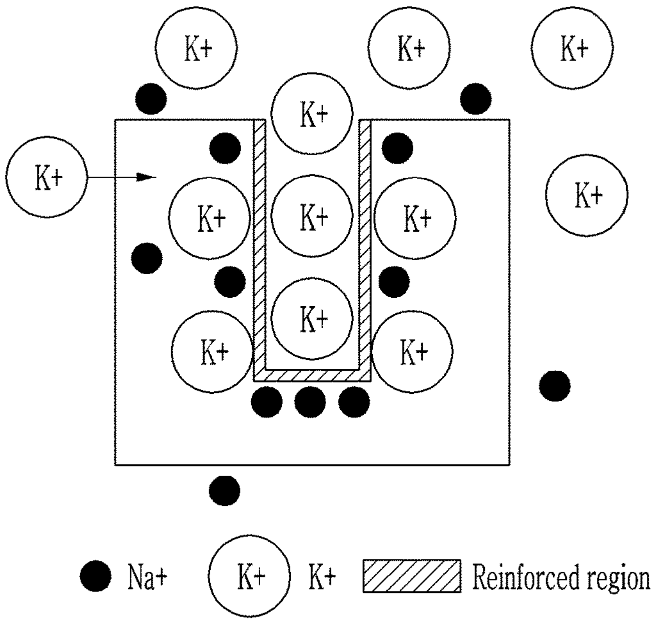
FIG. 4 is a view schematically showing a principle that window reinforcement occurs by KOH.

FIG. 4 is a view schematically showing a principle by which window reinforcement occurs by KOH. Referring to FIG. 4, the K+ ion in the KOH chemical solution undergoes a substitution reaction with the Na ion inside the glass. Accordingly, as shown in FIG. 4, the reinforcement by the ion substitution may occur in the edge or surface region of the window 100.

Figure 5:
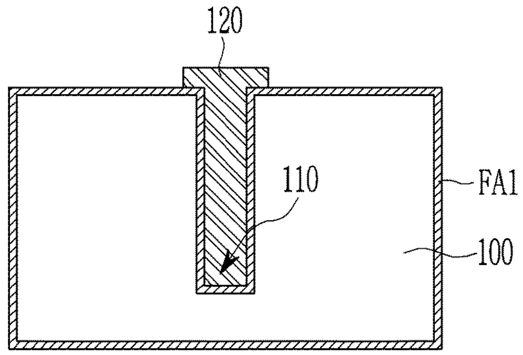
FIG. 5 is a view showing a masked window.

Next, referring to FIG. 5, the groove 110 of the window 100 is filled to be masked. FIG. 5 shows the masked window 100. As shown in FIG. 5, the masking may be performed by filling an inside of the groove 110 of the window 100 with a masking pattern 120. In an embodiment, as shown in FIG. 5, the masking pattern 120 may be disposed while filling the groove 110 of the window 100.

Figure 6:
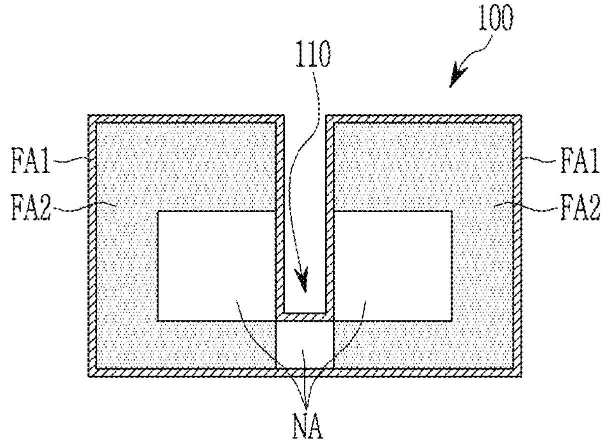
FIG. 6 is a view showing a window to which a secondary reinforcement occurs.

In an embodiment, as shown in FIG. 1, the masked window is secondarily reinforced (S30). In such an embodiment, the secondary reinforcement may be performed by using $KNO_3$. In such an embodiment, the secondary reinforcement is performed only in a non-masked region. FIG. 6 shows the window 100 in which the secondary reinforcement occurs. The secondary reinforcement region is indicated by FA2. As shown in FIG. 6, the edge or surface region of the window 100 except for the masked groove 110 region is reinforced. In such an embodiment, the secondary reinforcement region FA2 may be wider than the primary reinforcement region FA1.

Referring to FIG. 6, the window may include the primary reinforcement region FA1, the secondary reinforcement region FA2, and the non-reinforcement region NA.

In such an embodiment, the window 100 may be a window applied to the foldable display device. In such an embodiment, the groove 110 of the window 100 may correspond to (or overlap) a region where the foldable display device is folded. In such an embodiment, different stresses occur for each region of the window 100. Specifically, a compressive stress occurs near the edge of the window 100, and a tensile stress occurs in the central region and the region adjacent to the groove 110.

According to an embodiment of the invention, the manufacturing method of the window is performed by dividing the primary and secondary reinforcement processes, and particularly, in such an embodiment, the groove 110 is masked in the secondary reinforcement process to adjust the reinforcement region. In such an embodiment, by differently controlling the degree of the reinforcement in the region near the groove 110 and the degree of the reinforcement in the region without the groove, uniform chemical reinforcement may occur in the entire region of the window with the different thicknesses for each region. That is, the thickness of the window 100 differs for each region due to the formation of the groove 110, but this difference in the thickness may be compensated by performing the primary reinforcement and the secondary reinforcement after the masking. Therefore, the high strength may be maintained when the window is applied as a cover glass of the display device.

In such an embodiment, the manufacturing method of the window may maintain the uniform internal stress distribution in the window 100 in which the groove 110 is formed. As shown in FIG. 6, since the thickness of the reinforcement region in the region where the groove 110 is not formed is wider than that of the reinforcement region around the groove 110, the internal stress may be maintained uniformly.

Figure 7:
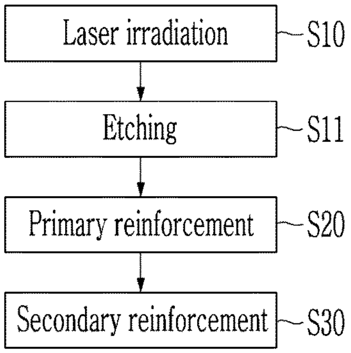
FIG. 7 is a process flowchart showing a manufacturing process according to an embodiment.

Next, an alternative embodiment of a manufacturing process of a window according to the invention will be described in detail. FIG. 7 is a process flowchart showing a manufacturing process according to an embodiment. An embodiment of the manufacturing process of the window includes radiating a laser to form a pattern (S10), etching (S11), primary reinforcing (S20), and secondary reinforcing (S30).

Figure 8:
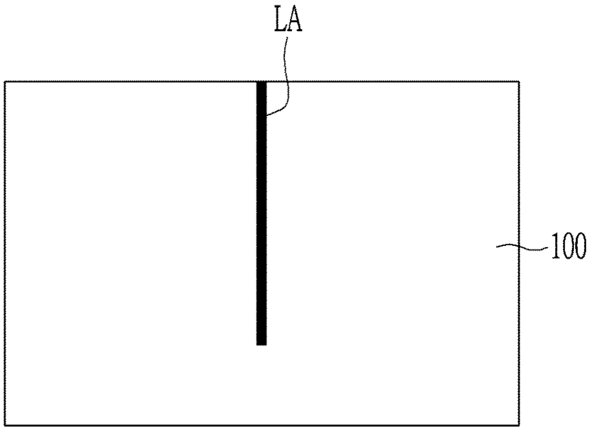
FIG. 8 is a view showing a window to which a laser is irradiated.

Referring to FIG. 7 and FIG. 8, the laser is radiated to the window to form the pattern (S10). FIG. 8 is a view showing a window 100 to which a laser is radiated. In FIG. 8, the laser irradiated region LA is shown. The laser irradiated region LA is a region to be removed by the etching, and as shown in FIG. 8, the laser irradiated region LA is formed in the partial region of the center of the window 100. The laser irradiated region LA suffers thermal damage and the damaged region is removed by the etching process in a subsequent process. In such an embodiment, by using the difference in the etching selectivity between the laser processed region and the unprocessed region, the window 100 may be etched into a desired shape.

Figure 9:
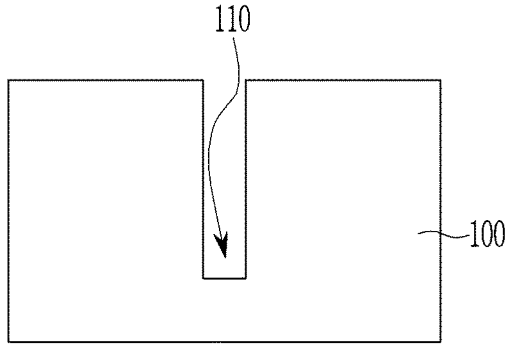
FIG. 9 is a view showing an etched window.

Next, referring to FIG. 7 and FIG. 9, the window 100 is etched. FIG. 9 is a view showing an etched window 100. In such an embodiment, the etching may be performed using HF as an etchant. When the etching and reinforcement process is performed simultaneously with KOH as in the embodiment described above with reference to FIG. 1, the process takes a long time and thus the productivity may be deteriorated. In an embodiment of the manufacturing method of the window, the etching process may be performed separately using HF, thereby improving the process productivity. The etching speed of HF is about 10 times or more that of KOH. The portion corresponding to the laser irradiated region LA of FIG. 8 is etched to form the groove 110.

Figure 10:
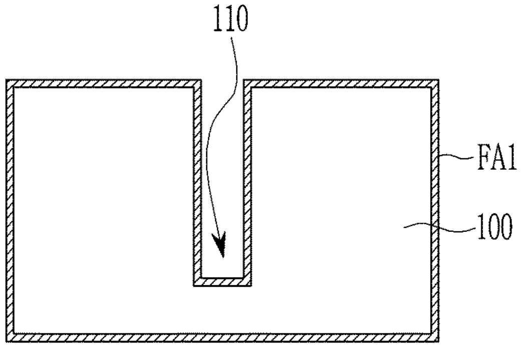
FIG. 10 is a view showing a window in which a primary reinforcement processes is performed.

Next, referring to FIG. 10, the window is primary reinforced by using KOH. FIG. 10 is a view showing a window 100 in which a primary reinforcement process is performed. The primary reinforcement may be performed by immersing the window in a chemical solution containing KOH. In such an embodiment, the reinforcement time may be about 30 minutes to about 72 hours. In such an embodiment, the KOH temperature may be about 50° C. or more and about 300° C. or less. If the temperature is below about 50° C., the reinforcement of the window may not be performed, and if the temperature is above about 300° C., it may be difficult to secure the process characteristic. Accordingly, in such an embodiment, 50° C. may be a minimum temperature at which the reinforcement depth of the window may be checked, and 300° C. may be a maximum temperature at which the process characteristic may be secured.

In FIG. 10, the primary reinforcement region FA1 where the primary reinforcement occurs is shown. In an embodiment, the reinforcement occurs in the edge or surface region of the window 100 by KOH. The thickness of the primary reinforcement region FA1 may be in a range of about 1 nm to about 20 μm.

Figure 11:
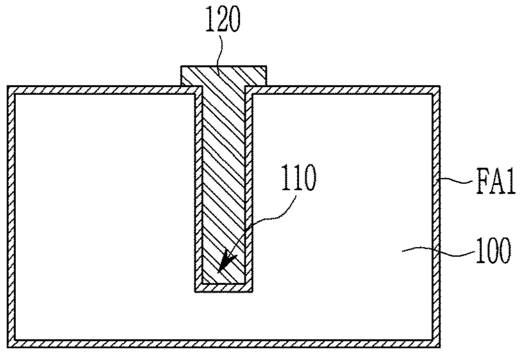
FIG. 11 is a view showing a masked window.

In an embodiment, referring to FIG. 11, the groove 110 of the window 100 is filled to be masked. FIG. 11 is a view showing a masked window 100. As shown in FIG. 11, the masking may be performed by filling the inside of the groove 110 of the window 100 with the masking pattern 120. As shown in FIG. 11, the masking pattern 120 may be positioned while filling the groove 110 of the window 100.

Figure 12:
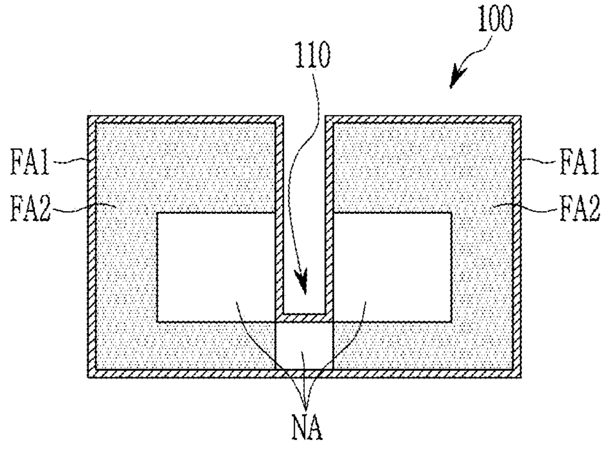
FIG. 12 is a view showing a window to which a secondary reinforcement occurs.

In an embodiment, as shown in FIG. 7 and FIG. 12, the masked window is secondarily reinforced (S20). In such an embodiment, the secondary reinforcement may be performed using $KNO_3$. In such an embodiment, the secondary reinforcement is performed only in the unmasked area. FIG. 12 is a view showing a window 100 to which a secondary reinforcement occurs. The secondary reinforcement region is represented by FA2. As shown in FIG. 12, the edge or surface region of the window 100 is reinforced, excluding the masked groove 110 region. In such an embodiment, the secondary reinforcement region FA2 may be wider than the primary reinforcement region FA1.

Referring to FIG. 12, the window 100 may include the primary reinforcement region FA1, the secondary reinforcement region FA2, and the non-reinforcement region NA. In such an embodiment, as described above, the primary reinforcement FA1 and the secondary reinforcement FA2 are applied to perform the uniform chemical reinforcement across all regions of the window 100 having different thicknesses for each region. Therefore, when the window 100 is used as the cover window such as for the foldable display device, the stress in the groove 110 where folding is performed and other regions is uniformly maintained to prevent the window from being damaged.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A manufacturing method of a window, the manufacturing method comprising:
radiating a laser to a glass;
etching the glass to which the laser is radiated to form a groove in the glass;
immersing the glass including the groove in a KOH solution to perform a primary reinforcement on an entire surface of the glass including the groove;
masking the groove of the primarily reinforced glass to selectively expose a non-groove region of the glass; and
performing a secondary reinforcement on the masked glass.

2. The manufacturing method of the window of claim 1, wherein
the etching the glass to which the laser is radiated includes using HF.

3. The manufacturing method of the window of claim 1, wherein
in the immersing of the glass including the groove in the KOH solution,
a temperature of the KOH solution is in a range of about 50° C. to about 300° C.

4. The manufacturing method of the window of claim 1, wherein
in the immersing of the glass including the groove in the KOH solution,
an immersion time is in a range of about 30 minutes to about 72 hours.

5. The manufacturing method of the window of claim 1, wherein
after the immersing the glass including the groove in the KOH solution,
a thickness of a primarily reinforced region of the glass is in a range of about 1 nm to about 20 μm.

6. The manufacturing method of the window of claim 1, wherein
the groove is positioned along a predetermined direction of the glass and does not penetrate the glass.

7. The manufacturing method of the window of claim 1, wherein
the performing the secondary reinforcement includes using $KNO_3$.

8. The manufacturing method of the window of claim 1, wherein
a thickness of a region of the glass where the secondary reinforcement is performed is thicker than a thickness of a region of the glass where the primary reinforcement is performed.

9. The manufacturing method of the window of claim 1, wherein
the window includes a primary reinforcement region, a secondary reinforcement region, and a non-reinforcement region.

10. The manufacturing method of the window of claim 1, wherein
the window is a cover window of a foldable display device, and the groove of the window corresponds to a region where the foldable display device is folded.

* * * * *